(12) United States Patent
Burkett et al.

(10) Patent No.: US 6,604,055 B1
(45) Date of Patent: Aug. 5, 2003

(54) SYSTEM AND METHOD FOR AC LINE VOLTAGE ANALYSIS

(75) Inventors: Douglas A. Burkett, Eaton, OH (US); Tim A. Landwehr, West Alexandria, OH (US)

(73) Assignee: Henny Penny Corporation, Eaton, OH (US)

( * ) Notice: Subject to any disclaimer, the term of this patent is extended or adjusted under 35 U.S.C. 154(b) by 85 days.

(21) Appl. No.: 09/676,939

(22) Filed: Oct. 2, 2000

Related U.S. Application Data

(60) Provisional application No. 60/156,435, filed on Sep. 28, 1999.

(51) Int. Cl.$^7$ ............................................. G01R 21/00
(52) U.S. Cl. ..................... 702/60; 702/60; 702/189; 702/107; 307/2; 307/7; 307/130; 323/247; 323/357; 323/371; 341/155; 700/75; 700/286; 700/297
(58) Field of Search ................................ 702/1, 57, 64, 702/65, 85, 107, 115, 118, 122, 124, 126, 183, 184, 188–190, 193, 197, 198; 307/2, 7, 11, 15, 17, 29, 31, 32, 34, 125, 130, 131, 132 E, 132 T, 134, 135; 323/234, 247, 266, 267, 277, 282, 283, 355, 356, 366, 371; 341/126, 144, 155; 374/1, 44, 135, 137, 149, 152; 700/28, 32, 33, 52, 54, 55, 75, 286, 297–300

(56) References Cited

U.S. PATENT DOCUMENTS 4,721,906 A * 1/1988 Ferguson et al. ........... 324/132
5,546,331 A * 8/1996 Matthews .............. 364/571.02

* cited by examiner

Primary Examiner—Marc S. Hoff
Assistant Examiner—Elias Desta
(74) Attorney, Agent, or Firm—Baker Botts L.L.P.

(57) ABSTRACT

A system and method for AC line voltage analysis is disclosed. According to one embodiment of the present invention, a system for AC line voltage analysis on an AC line includes a transformer that steps down the AC line voltage, a rectifier that rectifies the stepped down AC line current, a filter that filters the rectified AC line current, a voltage divider that reduces the AC line voltage; and an A/D converter that converts the reduced AC line voltage to digital bits. According to another embodiment of the present invention, a method for AC line voltage analysis of an AC line includes the steps of (1) calibrating equipment for measuring AC line voltage analysis, (2) adjusting for at least one load, (3) filtering an adjusted measurement; and (4) determining an actual line voltage.

13 Claims, 5 Drawing Sheets

SYSTEM AND METHOD FOR AC LINE VOLTAGE ANALYSIS

The present application claims priority from U.S. Provisional Patent Application Ser. No. 60/156,435, entitled "System And Method For AC Line Voltage Analysis," filed Sep. 28, 1999, the disclosure of which is incorporated by reference in its entirety.

BACKGROUND OF INVENTION

1. Field of the Invention

The present invention relates to cooking devices; specifically, it relates to a system and method for AC line voltage analysis.

2. Description of the Related Art

Variations in the AC line voltage supplied to restaurant food service equipment normally degrade cooking performance. These variations may result in incomplete cooking, overcooking, unappealing appearance, and substandard taste. Thus, this equipment may be equipped with devices that measure AC line voltage to detect such variations.

Referring to FIGS. 1–3, schematics of known devices to measure AC line voltage are provided. In FIG. 1, device 100 includes resistors 102 and 104 that lower a high line voltage to a low voltage that is safe for input to A/D converter 112. Bridge rectifier 106 half-wave rectifies the AC waveform. Resistor 108 and capacitor 110 filter the half-wave rectified waveform to a DC voltage. This signal is input to A/D converter 112, and the digital information is processed by microprocessor 114.

Although it is a relatively simple device, device 100 has its drawbacks. Specifically, device 100 does not have line isolation, which makes agency approvals, such as those from Underwriter's Laboratories, Inc. ("UL®"), difficult to obtain. In addition, because five distinct components are required, device 100 is costly.

Referring to FIG. 2, a second device for measuring AC line voltage is provided. Device 200 includes dedicated step-down transformer 202 that drops a high line voltage to a lower voltage. Bridge rectifier 204 full-wave rectifies the AC waveform. Resistor 206 and capacitor 208 filter the output of bridge rectifier 204 to a constant DC voltage, which is input to A/D converter 210, and processed by microprocessor 212.

Device 200 provides the line isolation that device 100 failed to provide. Transformer 202, however, is very large, heavy, and expensive. Further, the transfer function for transformer 202 is not tightly specified.

Referring to FIG. 3, a third known device for measuring AC line voltage is provided. Device 300 includes resistor 302, which limits the current input to optical isolator 304. Output 306 is a rectified AC waveform. Resistor 308 and capacitor 310 filter this waveform. Signal conditioning circuit 312 provides gain and offset to present a correct and suitable voltage to A/D converter 314, the output of which is processed by microprocessor 316.

Device 300 provides optical isolation from the line voltage. Resistor 302, however, must be a high-power resistor, which is inherently large and generates heat. Optical isolator 304 has transfer characteristics that are poorly controlled and change over time. Finally, signal conditioning circuit 312 adds an additional part and increases overall manufacturing costs.

SUMMARY OF THE INVENTION

Therefore, a need has arisen for a system and method for AC line voltage analysis that overcomes these and other deficiencies in the related art.

According to one embodiment of the present invention, a system for AC line voltage analysis is disclosed. The system for AC line voltage analysis on an AC line includes a transformer that steps down the AC line voltage, a rectifier that rectifies the stepped down AC line current, a filter that filters the rectified AC line current, a voltage divider that reduces the AC line voltage; and an A/D converter that converts the reduced AC line voltage to digital bits. According to another embodiment of the present invention, a system for AC line voltage analysis on an AC line includes a device that calibrates equipment for measuring AC line voltage analysis, a device that adjusts for at least one load, a device that filters an adjusted measurement, and a device that determines an actual line voltage.

According to another embodiment of the present invention, a method for AC line voltage analysis is disclosed. The method for AC line voltage analysis of an AC line includes the steps of calibrating equipment for measuring AC line voltage analysis, adjusting for at least one load, filtering an adjusted measurement; and determining an actual line voltage.

The method determines the loading effect of loads, such as the heat relay and the pressure solenoid, as well as LED light bars and alphanumeric displays. It may not be necessary to determine the loading effect for all loads.

The net result of the first calibration step is a table of offsets, in A/D bits, which are applied during subsequent AC voltage measurement.

Two known, constant AC line voltages are applied to the transformer, and the process control measures the A/D bit outputs at these two voltages and performs a two-point calibration. The resulting equation is then later used during normal operation to calculate the AC line voltage from the A/D measurement.

After the calibration is performed, the AC line voltage measurement is carried out by the process control. The control software reads the A/D converter.

The control software modifies the A/D reading by the appropriate offsets for load which were one during the A/D measurement.

The control software calculates the AC line voltage from the transfer function found during calibration.

The control software converts the AC line voltage measurement to a percent of nominal line voltage, for the purposes of comparison and indication. This is a user-interface convenience in that the end user need not know the nominal line voltage: if the control reports a line voltage of 100%, the user knows that the line voltage is correct, regardless of the actual nominal line voltage.

DESCRIPTION OF THE PREFERRED EMBODIMENT

Figure 1:
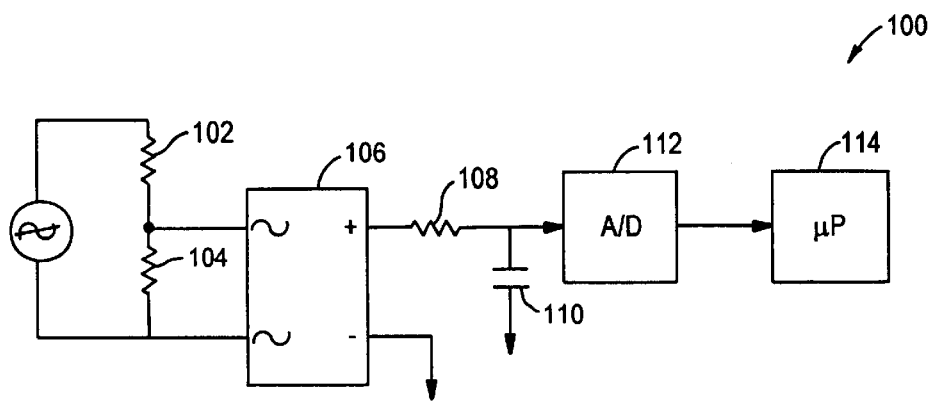
FIG. 1 is a schematic of a known AC line voltage measuring device.
Figure 2:
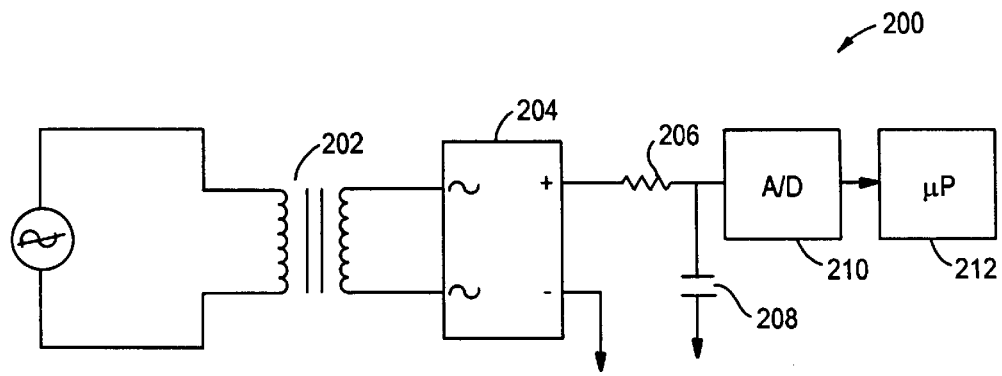
FIG. 2 is a schematic of another known AC line voltage measuring device.
Figure 3:
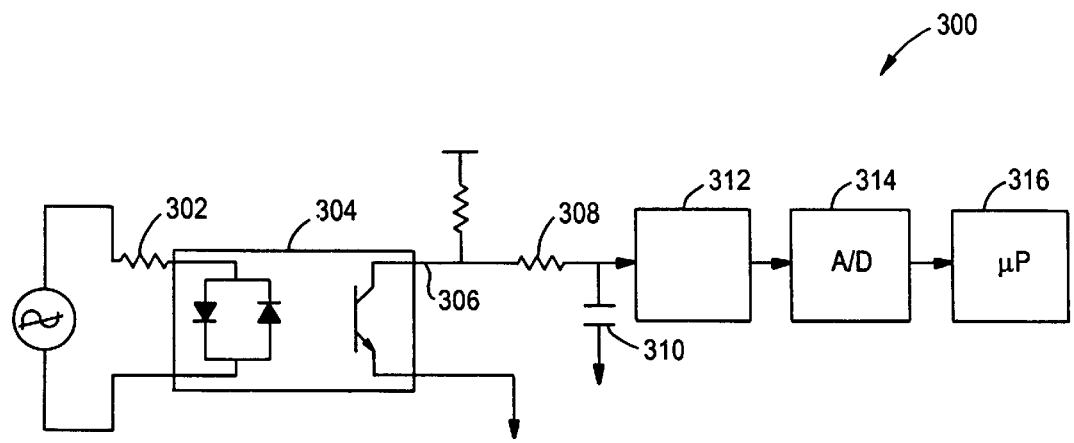
FIG. 3 is a schematic of another known AC line voltage measuring device.
Figure 4:
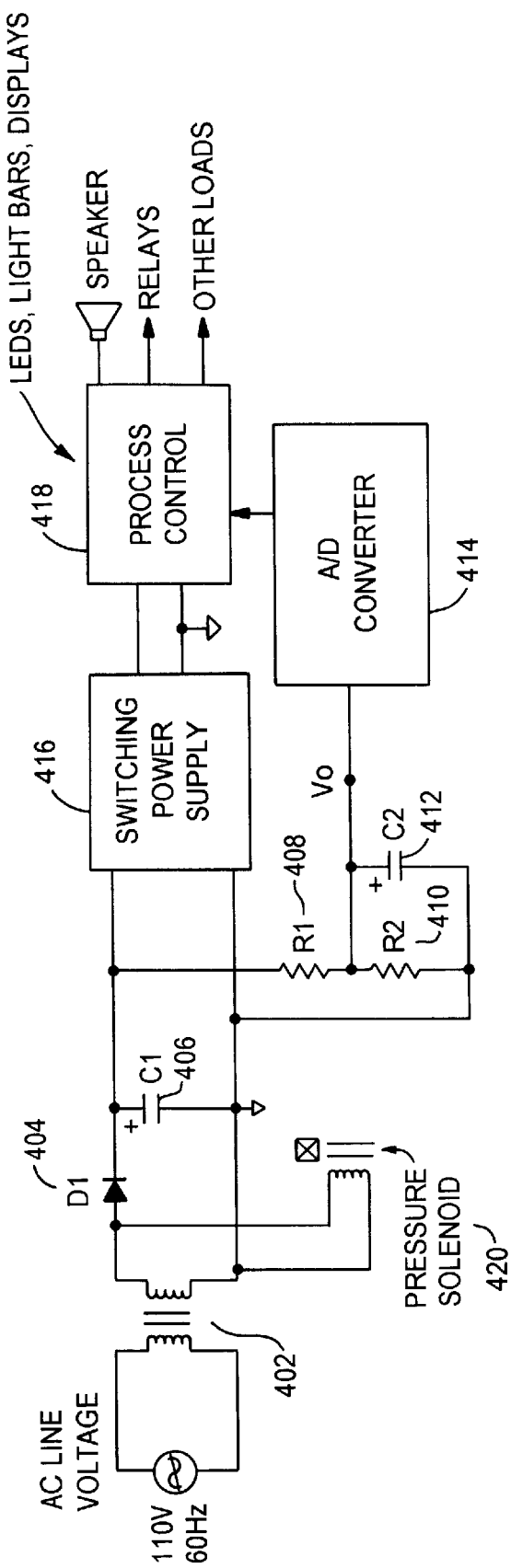
FIG. 4 is a schematic of a AC line voltage measuring device according to one embodiment of the present invention.

Embodiments of the present invention and their technical advantages may be better understood by referring to FIGS. 4 though 7, like numerals referring to like and corresponding parts of the various drawings.

Referring to FIG. 4, a AC line voltage analysis device according to one embodiment of the present invention is provided. Transformer 402, on its primary side, is supplied with an AC line voltage, and steps down the AC line voltage. The device of the present invention may be used with a variety of AC line voltages, including, but not limited to, 110 V, 220 V, etc. In one embodiment, transformer 402 steps down the primary voltage (220 V) by a factor of 20. In another embodiment, transformer 402 steps down the primary voltage (110 V) by a factor of 10. The stepped-down line voltage on the secondary side of transformer 402 is half-wave rectified by diode 404. In one embodiment, diode 404 may be a full-wave bridge rectifier.

In one embodiment, transformer 402 may be part number 4000-104-C02AB531, manufactured by Products Unlimited, Sterling, Ill.

The rectified voltage is then filtered to capacitor 406. Capacitor 406 may have a value from about 450 $\mu$F to about 10,000 $\mu$F. In one embodiment capacitor 406 has a value of 1000 $\mu$F.

In one embodiment, pressure solenoid 420 may be provided. A pressure solenoid may be used when the device of the present invention is used in conjunction with a pressure cooker. Pressure solenoid 420 functions to allow the pressure in a cooking vessel to increase. More importantly to the present invention, however, pressure solenoid 420 serves as load on transformer 402.

Resistors 408 and 410 form a voltage divider that samples the rectified, filtered voltage. The values of 408 and 410 are chosen to limit the maximum A/D input voltage to a safe level considering the maximum primary input voltage, transfer function of transformer 402, and loading of transformer 402. The range of suitable voltage for input to A/D converter 414 may range from about 0 volts to about 5 volts. In one embodiment, resistor 408 is a 121 k$\Omega$ resistor, and resistor 410 is a 11 k$\Omega$ resistor. These values for resistors 408 and 410 reduce the filtered supply voltage by about a factor of 10. Other suitable resistor values may also be used.

Capacitor 412 further filters the sampled voltage. Generally, because this is a half-wave rectified power supply, there will be significant ripple. Capacitor 412 is therefore chosen to reduce ripple and noise to levels commensurate with the desired measurement certainty. Capacitor 412 may have a value from about 0.1 $\mu$F to about 10 $\mu$F. In one embodiment, capacitor 412 is a 10 $\mu$F capacitor.

The voltage divider output, $V_o$, is connected to A/D converter 414. A/D converter 414 may be any suitable A/D converter. In one embodiment, A/D converter 414 may be part no. TLC25443CN, manufactured by Texas Instruments, Inc., Dallas, Tex.

Switching power supply 416 provides process control 418 with a DC power supply. In one embodiment, this may be a supply of +5 V. Switching power supply 416 may be any appropriate power supply with an input of 10–40 V DC and a 5 V DC output.

Process control 418 reads the output of A/D converter 414 to determine the AC line voltage on the primary side of the transformer 402. Since the filtered supply voltage is a function of the primary coil voltage of transformer 402, the primary voltage can be inferred from the secondary voltage.

One advantage of the circuit of the present invention is that it measures the AC line voltage at very low cost, since the only additional components are two resistors and a capacitor. Process control 418, for example, may already include A/D converter 414. In addition, a single transformer 402 may be provided to function both a power supply and a transducer. In other words, an additional transformer to serve as a transducer is not required.

The voltage measured by A/D converter 414 is not only a function of the primary coil voltage, but also of the transfer function of transformer 402, and the current load on the secondary coil of transformer 402. This secondary coil loading includes loads connected directly to the secondary coil, such as heat contactors and pressure solenoids, and loads which are indirectly connected, such as process control 418, which are connected to switching power supply 416. Since these loads change the secondary coil voltage while the primary voltage remains constant, they must be compensated for. In the present invention, they are compensated for by software on process control 418 during a calibration process.

Figure 5:
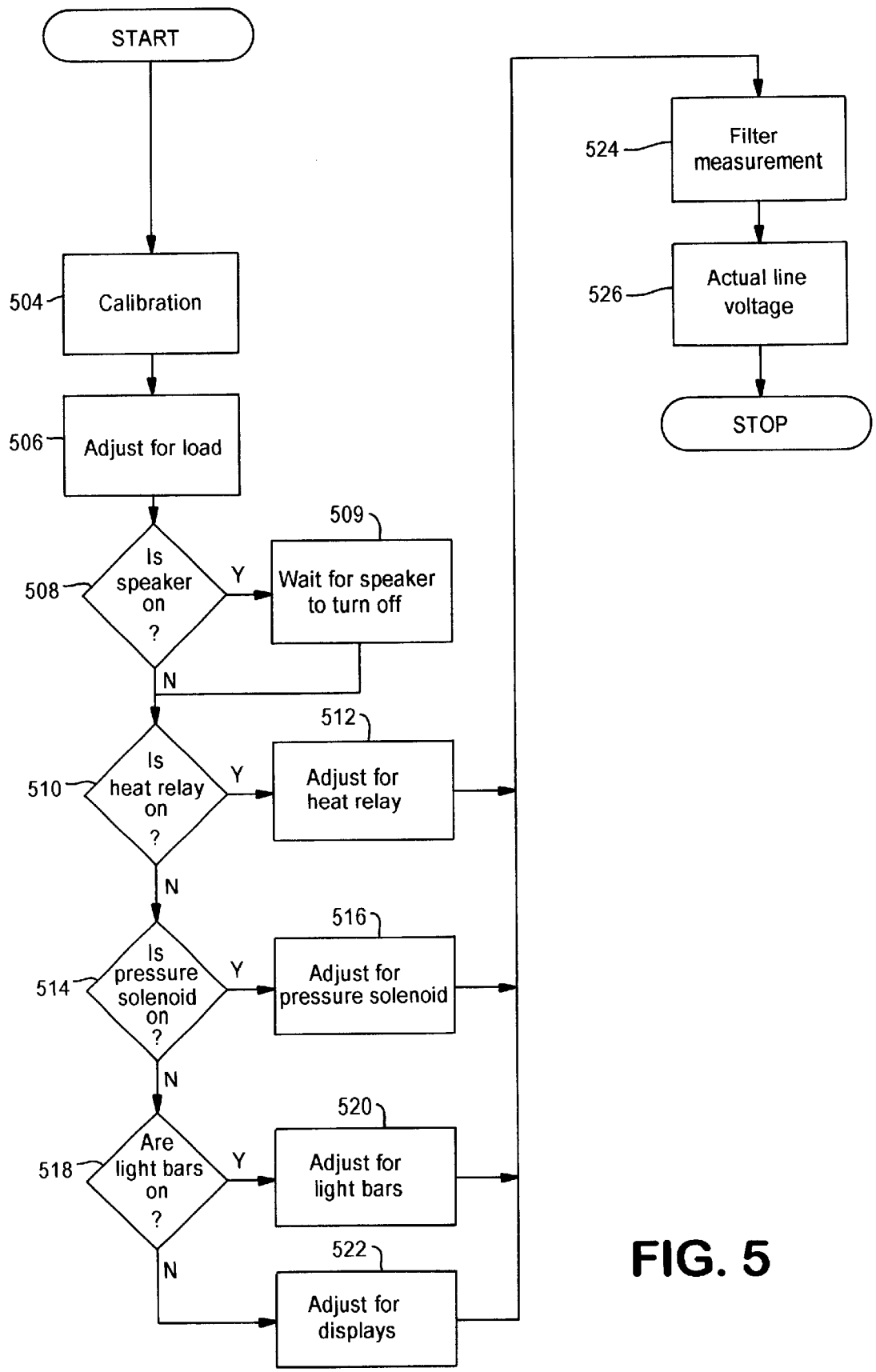
FIG. 5 is a flowchart of a method for AC line voltage measurement according to one embodiment of the present invention.
Figure 6:
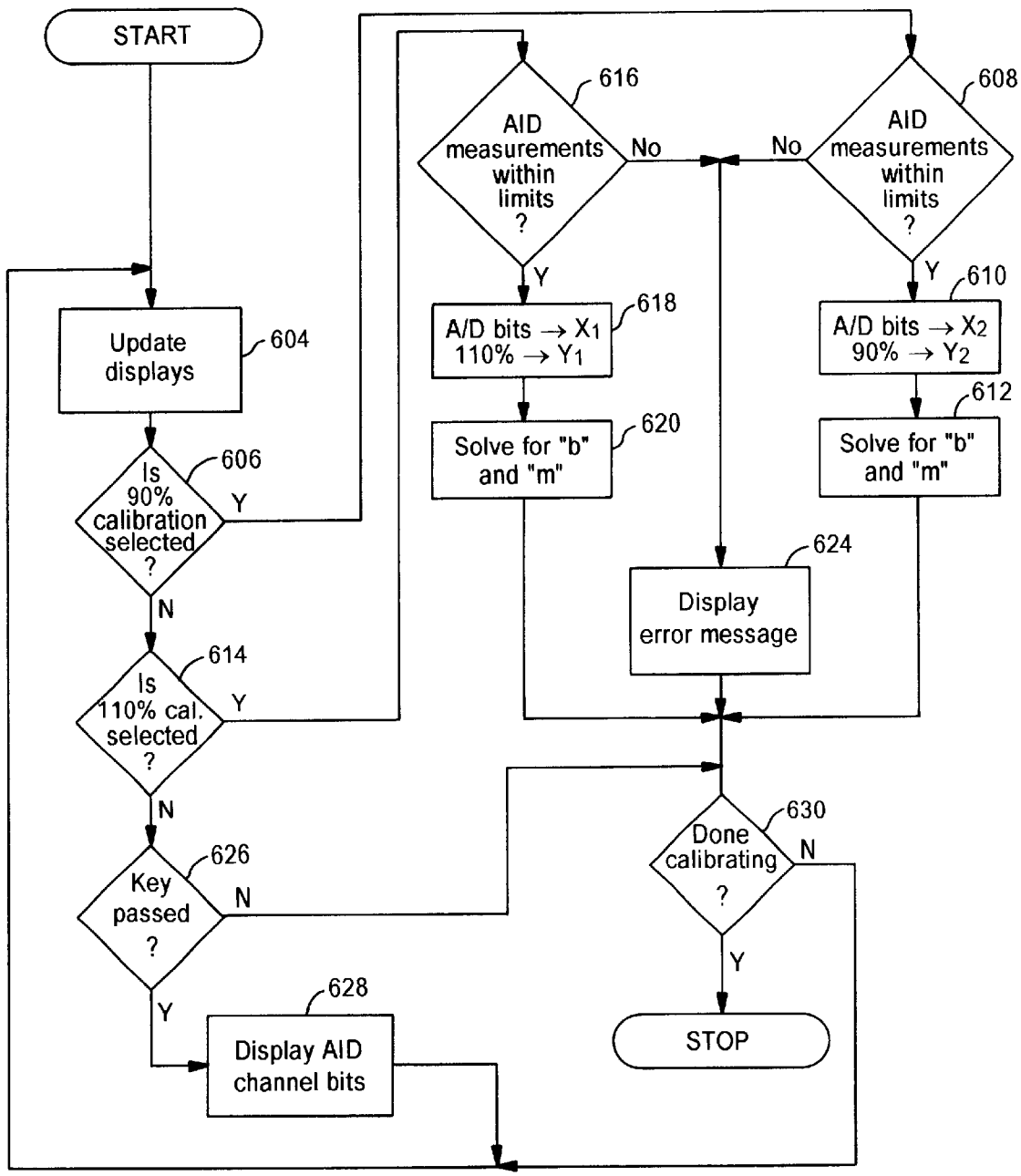
FIG. 6 is a flowchart of a method for two point calibration according to one embodiment of the present invention.

Referring to FIG. 5, a flowchart of a calibration process according to one embodiment of the present invention. In step 504, the equipment is calibrated. Referring to FIG. 6, a calibration process according to one embodiment of the present invention is provided.

In step 604, the system updates its displays. This may include displaying status and operator information, including, inter alia, the progress of the calibration, instructions, etc.

In step 606, the system queries to determine the level of calibration required. Many different levels of calibration may be used; in one embodiment, which will be described below, the system uses 90% and 110% calibration. These levels are chosen because AC current normally operates within 90% to 110% of its stated voltage value (normally 110 or 220 volts). By calibrating at 90% and 110%, the error will be minimized at these points.

If 90% calibration is selected, the input voltage is set at 90% of its stated value. This may be accomplished manually or by the controller. In one embodiment, the operator may use a variable AC transformer to set the voltage at 90% of its stated input level.

Next, in step 608, the system queries whether the A/D measurements are within specified limits. In one embodiment, the A/D reading must be between about 1250 bits and about 2917 bits. These limits represent effects of component tolerance errors. If they within range, the system continues to step 610. If the measurements are not within limits, indicating system malfunction, which may be in the transformer or in the circuit, the system displays an error message in step 624.

In step 610, the system assigns the A/D bits to the variable "$X_2$", and 90% to variable "$Y_2$" of the linear equation "$Y_2=mX_2+b$."

In step 612, the system solves the linear equations "$Y_1=mX_1+b$" and "$Y_2=mX_2+b$" for m and b. In one embodiment, if 110% calibration has not yet been performed, default values for $Y_1$ and $X_1$ may be used.

In step 614, the system queries if 110% calibration is selected. If it is, a similar process to that for 90% calibration is performed. First, the input voltage is set at 110% of its stated value. This may be accomplished manually or by the controller. In one embodiment, the operator may use a variable AC transformer to set the voltage at 110% of its stated input level.

Next, in step 616, the system queries whether the A/D measurements are within specified limits. In one embodiment, the A/D reading must be between about 2038 bits and about 3058 bits. These limits represent effects of component tolerance errors. If they are, the system continues to step 618. If the measurements are not within limits, indicating system malfunction, the system displays an error message in step 624.

In step 618, the system assigns the A/D bits to the variable "$X_1$," and 110% to variable "$Y_1$" of the linear equation "$Y_1=mX_1+b$."

In step 620, the system solves the linear equations "$Y_1=mX_1+b$" and "$Y_2=mX_2+b$" for m and b. In one embodiment, if 90% calibration has not yet been performed, default values for $Y_2$ and $X_2$ may be used.

If 110% calibration is not selected, in one embodiment, in step 626, the system queries if a display key is pressed. If it is not, the system returns to step 604. If it is pressed, in step 628, the system displays A/D channel bits, and then returns to step 604.

In one embodiment, a diagnostic key may be provided for diagnostic purposes.

In step 630, the system queries if calibration is complete. In one embodiment, 90% and 110% calibration may be performed several times in order to more precisely establish the values of "m" and "b." Whether or not calibration is complete may be determined by requesting user input, or after a predetermined number of calibration cycles. In one embodiment, if the values of "m" and "b" change by less than a predetermined percentage, the system may automatically stop calibration. If calibration is not complete, the system returns to step 604.

After calibration is complete, the system returns to step 506 of FIG. 5.

Figure 7:
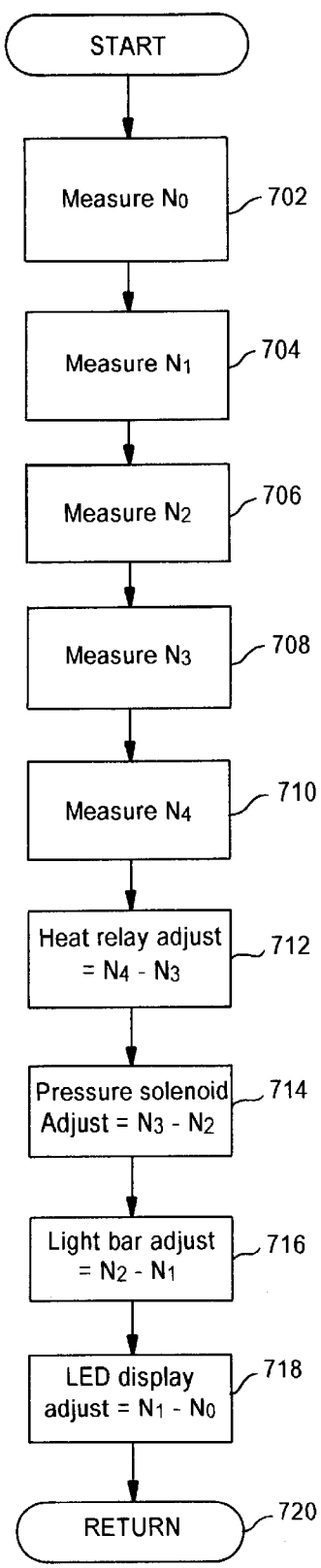
FIG. 7 is a flowchart of a method for transformer load adjustment according to one embodiment of the present invention.

Referring again to FIG. 5, in step 506, adjustments for transformer loads are made. Referring to FIG. 7, a process for making adjustments is provided.

In step 702, all loads, if not already off, are turned off. These loads may include, inter alia, LED displays, light bars, the pressure solenoid, and the heat relay. Other loads, as provided, may also be adjusted for. Conversely, if the system does not include LED displays, light bars, or a pressure solenoid, the respective steps may be omitted. As each load is turned on, it is left on for subsequent measurements.

First, the A/D input value is measured with no load, and this value is stored as $N_0$.

In step 704, the LED displays are turned on, and the value of the A/D input is measured and stored as $N_1$.

In step 706, the light bars are turned on, and the value of the A/D input is measured and stored as $N_2$.

In step 708, the pressure solenoid is turned on, and the value of the A/D input is measured and stored as $N_3$.

In step 710, the heat relay is turned on, and the value of the A/D input is measured and stored as $N_4$.

In step 712, the system determines the heat relay adjustment. This adjustment is equivalent to $N_4-N_3$.

In step 714, the system determines the pressure solenoid adjustment. This adjustment is equivalent to $N_3-N_2$.

In step 716, the system determines the light bar adjustment. This adjustment is equivalent to $N_2-N_1$.

In step 718, the system determines the LED display adjustment. This adjustment is equivalent to $N_1-N_0$.

In step 720, the system returns to step 508 of FIG. 5.

It should be noted that the adjustments may be made anytime after their base measurements are made (e.g., the LED adjustment may be determined after $N_1$ and $N_0$ are measured).

Referring again to FIG. 5, in step 508, the system determines if the speaker is on. If the speaker is on, the system waits for the speaker to turn off. This is because, as discussed above, the speaker is not a constant load, and its load will depend on factors, such as frequency, volume, etc. Therefore, although the load of the speaker could be modeled and compensated for, because the speaker is used relatively infrequently, in step 509, the system waits for the speaker to be in its "off" state before continuing.

If the speaker was not on, in step 510, the system determines if the heat relay is on. If the heat relay is on, in step 512, adjustments for the heat relay are made. This involves taking the value measured in step 712, $N_4-N_3$, and adding or subtracting this value to the A/D reading. For example, if it is determined that the heat relay causes the A/D converter to drop by four bits, four bits are added to the measured A/D value.

If the heat relay is not on, in step 514, the system determines if the pressure solenoid is on. If the pressure solenoid is on, in step 516, adjustments for the pressure solenoid are made. This is accomplished in the manner as with the adjustments for the heat relay in step 512, above.

If the pressure solenoid is not on, in step 518, the system determines if the light bars are on. If the light bars are on, in step 520, adjustments for the light bars are made, in a manner similar to that above.

If the light bars are not on, in step 522, adjustments for the displays are made. In one embodiment, because several displays are used, and they may be cycled on and off, an estimated value for displays are used.

Next, in step 524, the system filters the measurement. This is accomplished with a digital low-pass filter. Filtering makes the measurement more readable.

Next, in step 526, the system determines the actual line voltage. After all adjustments are made, and after filtering, the system uses the constant b and coefficient m, which were determined in steps 612 and 620, above, and determines the percentage of line voltage.

While the invention has been described in connection with preferred embodiments, it will be understood by those skilled in the art that other variations and modifications of the preferred embodiments described above may be made without departing from the scope of the invention. Other embodiments will be apparent to those skilled in the art from a consideration of the specification or practice of the invention disclosed herein. It is intended that the specification is considered as exemplary only, with the true scope and spirit of the invention being indicated by the following claims.

What is claimed is:

1. A system for AC line voltage analysis on an AC line, comprising:

a transformer that steps down the AC line voltage;

a pressure solenoid that acts as a load on the transformer;

a rectifier that rectifies the stepped down AC line current;

a filter that filters the rectified AC line current;

a voltage divider that reduces the AC line voltage; and an A/D converter that converts the reduced AC line voltage to digital bits.

2. The system of claim 1, wherein the transformer functions as a transducer.

3. A system for AC line voltage analysis on an AC line, comprising:

a device that calibrates equipment for measuring AC line voltage analysis;

a device that adjusts for at least one load, wherein the at least one load comprises a pressure solenoid;

a device that filters an adjusted measurement; and a device that determines an actual line voltage.

4. The system of claim 3, further comprising:

a display that displays information to an operator.

5. A method for AC line voltage analysis of an AC line, comprising:

calibrating equipment for measuring AC line voltage analysis;

adjusting for at least one load, wherein the at least one load comprises a pressure solenoid;

filtering an adjusted measurement; and determining an actual line voltage.

6. The method of claim 5, wherein said step of calibrating equipment for measuring AC line voltage analysis comprises:

determining a level of calibration desired;

determining if a measurement is within a predetermined range; and determining a constant and a slope for an equation representing a line voltage.

7. The method of claim 6, wherein said step of determining a level of calibration comprises:

selecting a predetermined calibration level;

setting a line voltage at said predetermined calibration level;

measuring said line voltage.

8. The method of claim 7, wherein said step of measuring said line voltage comprises:

converting said line voltage to digital information.

9. The method of claim 7, wherein said predetermined calibration level is selected from the group consisting of 90 percent and 110 percent of a stated line voltage.

10. The method of claim 5, wherein the at least one load further comprises a heat relay.

11. The method of claim 5, wherein the at least one load further comprises a light bar.

12. The method of claim 5, wherein the at least one load further comprises a display.

13. The method of claim 5, further comprising displaying information to an operator.

* * * * *